United States Patent [19]
Newman

[11] Patent Number: 5,409,863
[45] Date of Patent: Apr. 25, 1995

[54] METHOD AND APPARATUS FOR CONTROLLING ADHESIVE SPREADING WHEN ATTACHING AN INTEGRATED CIRCUIT DIE

[75] Inventor: Keith G. Newman, Sunnyvale, Calif.

[73] Assignee: LSI Logic Corporation, Milpitas, Calif.

[21] Appl. No.: 19,739

[22] Filed: Feb. 19, 1993

[51] Int. Cl.⁶ .............................................. H01L 21/60
[52] U.S. Cl. ................................... 437/209; 437/211; 437/214; 437/215; 437/217; 437/219; 437/220
[58] Field of Search ............... 437/209, 210, 211, 212, 437/213, 214, 215, 216, 217, 218, 219, 220; 257/676

[56] References Cited

U.S. PATENT DOCUMENTS

| | | | |
|---|---|---|---|
| 4,143,456 | 3/1979 | Inoue | 437/219 |
| 4,647,959 | 3/1987 | Smith | 437/217 |
| 5,041,395 | 8/1991 | Steffen | 437/217 |
| 5,061,990 | 10/1991 | Arakawa | 257/676 |
| 5,156,983 | 10/1992 | Schlesinger et al. | 437/217 |

FOREIGN PATENT DOCUMENTS

| | | | |
|---|---|---|---|
| 60-84854 | 5/1985 | Japan | 257/676 |
| 3-42847 | 2/1991 | Japan | 257/676 |

*Primary Examiner*—Brian E. Hearn
*Assistant Examiner*—Kevin Picardat
*Attorney, Agent, or Firm*—Honigman Miller Schwartz and Cohn Schwartz and Cohn

[57] ABSTRACT

An apparatus and method for controlling unwanted spread of adhesive used to attach a semiconductor integrated circuit die to an integrated circuit package assembly. A barrier prevents the adhesive from spreading onto bond finger connections of the integrated circuit package. The barrier may be a solder mask ring outside of and encircling the perimeter of the die attachment area of the package assembly. The barrier is located between the die attachment area and the adjacent bond fingers of the package.

4 Claims, 2 Drawing Sheets

METHOD AND APPARATUS FOR CONTROLLING ADHESIVE SPREADING WHEN ATTACHING AN INTEGRATED CIRCUIT DIE

BACKGROUND OF THE INVENTION

1. Field of the Invention

This invention relates generally to fabricating integrated circuit packages, and in particular, to an apparatus and method that controls unwanted spreading of adhesive used to attach semiconductor integrated circuit dies to an integrated circuit package assembly.

2. Description of the Related Technology

The semiconductor integrated circuit has revolutionized the field of electronics by becoming a basic building block in electronic products. The integrated circuit has made it possible to create many new electronic products and related services in the consumer, industrial and military markets. As more and more electronic products were introduced, a great demand for the integrated circuits used to build these products was created.

This demand resulted in a new industry devoted to manufacturing semiconductor integrated circuits in quantity and at a price that was acceptable in the various electronic markets. In order to keep the price of integrated circuits as low as possible, assembly line, automation and large quantity manufacturing techniques were required.

Packaging techniques for integrated circuits have been developed to satisfy demands for miniaturization in the semiconductor industry. Improved methods for miniaturization of integrated circuits enabling the integration of millions of transistor circuit elements into single integrated silicon embodied circuits, or chips, have resulted in increased emphasis on methods to package these circuits in space efficient, yet reliable and mass producible packages.

Integrated circuits are created from a silicon wafer using various etching, doping and depositing steps that are well known in the art of fabricating integrated circuit devices. A silicon wafer is comprised of a number of integrated circuit dies that each represent a single integrated circuit chip. Ultimately, the die or chip may be packaged by transfer molding plastic encasement around the die with a variety of pin-out or mounting and interconnection schemes. For example, M-Dip (Dual-In-Line-Plastic) provides a relatively flat, molded package having dual parallel rows of leads extending from the bottom for through-hole connection, and mounting to an underlying printed circuit board. More compact integrated circuits allowing greater density on a printed circuit board are the SIP (Single-In-Line-Plastic), PLCC (Plastic Leaded Chip Carrier), and SOJ (Small Outline J-leaded) molded case packages.

Integrated circuits are comprised of many interconnected transistors and associated passive circuit elements that perform a function or functions. These functions may be random access memory, central processing, communications, etc. Different types of integrated circuits are used to create an electronic system such as a personal computer. Combining integrated circuits requires electrically connecting each integrated circuit together to form the electronic system. Once the integrated circuits are connected together in a system, other devices such as keyboards, video monitors and printers may be connected to and utilized with the system.

In order to accomplish this interconnection, conductive paths must be made available to connect the internal circuitry of the integrated circuit die to external system electrical circuits. The integrated circuit die uses metallized bumps or "bond pads" which are connected to the internal circuits of the die.

The integrated circuit package has conductors called "bond fingers" that are connected to the bond pads of the integrated circuit die by wire bonding, tape automated bonding ("TAB"), wedge bonding, ball bonding or other methods well known in the art. The bond fingers are connected to the integrated circuit package pins that are used to connect to printed circuit boards.

Before the integrated circuit die bond pads are connected to the integrated circuit package, the die must be mechanically attached to the package assembly. Epoxy adhesive containing silver filler particles may be used for attachment of the die to the package assembly. Epoxy adhesive, however, spreads or "bleeds" away from the adhesion area. Both the silver filled epoxy and the epoxy resin base spread or bleed away from the die and package mounting area. Any filled epoxy or epoxy resin that flows onto a bond finger contaminates this bond finger and may result in a defective wire bond thereto.

To control the epoxy from spreading or bleeding onto the bond fingers, the die and adhesive may be recessed into a cavity. The bond fingers adjacent to the die are placed above the surface of the die attachment cavity and this cavity substantially prevents epoxy from spreading or bleeding onto bond fingers above. Integrated circuit package assemblies requiring a large number of pins such as, for example, those using very large scale integrated (VLSI) circuit dies, do not always have the option of an attachment cavity. These VLSI package assemblies have the bond fingers at the same level as the die attachment surface.

What is needed in fabricating VLSI semiconductor integrated circuit dies with corresponding high density packages is a way to prevent adhesive spreading of the die attachment epoxy onto the adjacent bond fingers when both are on the same surface plane.

SUMMARY OF THE INVENTION

In contrast to prior methods of preventing chip attachment epoxy from bleeding onto adjacent bond fingers of an integrated circuit package assembly, the present invention provides a method and apparatus for substantially reducing attachment epoxy spreading or bleed out onto the adjacent bond fingers. The embodiment of the present invention utilizes a barrier such as, for example, a solder mask ring outside of and encircling the perimeter of the die attachment area of the package assembly. The barrier is located between the die attachment area and the adjacent bond fingers of the package.

Using a solder mask ring as a barrier allows easy and economical fabrication during manufacture of the integrated circuit package. In some cases, the solder mask ring barrier requires no additional fabrication process steps to the package construction. A solder mask is normally used over the package conductor traces, thus, only art work patterns need be changed to include a solder mask ring barrier that will substantially reduce epoxy spreading or bleed out onto adjacent bond fingers.

The solder mask may be, for example, a screen printed epoxy resin mask. The barrier may be applied as a dry film or liquid coating (wet film) coating that is subsequently cured and selectively etched. The barrier may be any number of polymeric compounds, for example, epoxies and polyimides. One skilled in the art of integrated circuit fabrication would readily understand the range of useful materials and processes for creating a barrier around a die attachment area.

An object of the present invention is to substantially reduce integrated circuit die attachment adhesive from spreading onto adjacent integrated circuit package assembly connections.

Another object of the present invention is to incorporate a barrier for substantially reducing adhesive spreading onto integrated circuit package assembly connections without adding steps to the integrated circuit manufacturing process.

A further object of the present invention is to utilize a solder mask as the adhesive barrier.

A feature of the present invention is utilizing a barrier around the perimeter of the die attachment area of the integrated circuit package assembly.

Another feature of the present invention is positioning the barrier between the die adhesive and the bond fingers of the package assembly.

Still a further feature of the present invention is to fabricate the adhesive barrier from a solder mask step during the manufacturing process.

An advantage of the present invention is substantially reducing die adhesive spreading onto package assembly conductors.

Another advantage of the present invention is to easily create an adhesive barrier with a solder mask.

Other and further objects, features and advantages will be apparent from the following description of a presently preferred embodiment of the invention, given for the purpose of disclosure and taken in conjunction with the accompanying drawings.

DETAILED DESCRIPTION OF THE PREFERRED EMBODIMENT

Figure 1:
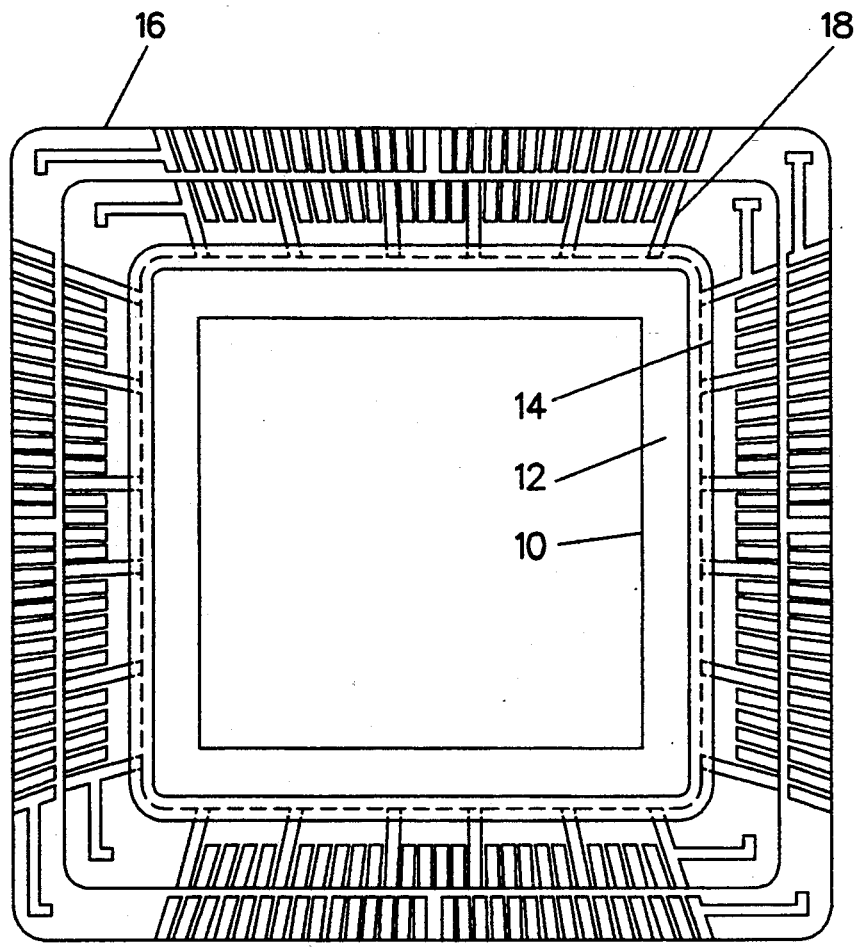
FIG. 1 is a schematic plan view of the embodiment of the present invention.
Figure 1:

Referring now to the drawings, the details of the preferred embodiment are schematically illustrated. In the drawings, the letter S designates generally a semiconductor integrated circuit package. The integrated circuit package S is schematically illustrated in plan view in FIG. 1. The package S of the present invention comprises an integrated circuit die 10, a die attachment area 12, a solder mask ring barrier 14, a package assembly 16, and a plurality of bond fingers 18.

Figure 2:
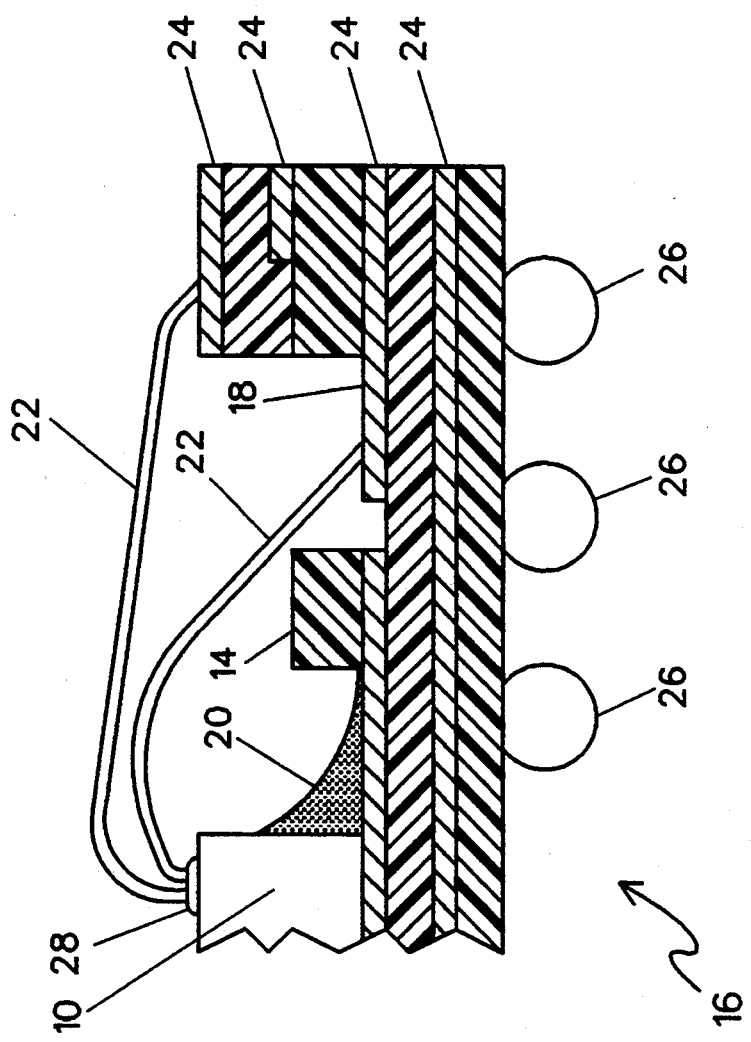
FIG. 2 is a partial cross section elevational view of the embodiment illustrated in FIG. 1.

Referring now to FIG. 2, a schematic cross section elevational view of the present invention is illustrated. Integrated circuit die 10 is attached to the package assembly 16 by adhesive 20. Adhesive 20 may be, for example, epoxy with silver filler particles. Depending on the amount of adhesive 20 and curing process, the adhesive 20 can spread onto the bond fingers 18. If the adhesive 20 covers bond fingers 18, then a wire bond connection 22 may not be reliably made.

The present invention substantially reduces the possibility of the adhesive 20 from spreading onto the bond fingers 18 by means of a solder mask ring barrier 14. The solder mask ring barrier 14 may be, for example, a solder mask ring outside of and encircling the perimeter of the die attachment area 12 of the package assembly 16. The solder mask ring barrier 14 is preferably located between the die attachment area 12 and the adjacent bond fingers 18 of the package assembly 16.

The solder mask barrier 14 may be applied at the same time as other solder masks are applied to the package assembly 16 during manufacturing. The preferred embodiment of the present invention may utilize a solder mask barrier 14 having a width of from 2 mils to 40 mils, and a height of from 0.5 mil to 5 mils. Other solder masks may be used to cover package assembly 16 conductors 24. The conductors 24 connect the bond fingers 18 to solder balls 26.

The package assembly 16 comprises a printed circuit board type of electrical signal conductor distribution that connects the many signals, ground and power circuits from the integrated circuit die 10 bond pads 28 through the wire bond connection 22 to the bond fingers 18 of the package assembly 16. The bond fingers 18 are connected by conductors 24 to the solder balls 26. The solder balls 26 connect to the system level circuit board (not illustrated).

As can be readily seen by those skilled in the art, the method and apparatus of the present invention may be easily adapted to existing integrated circuit package fabrication or new fabrication processes having to do with the manufacture of semiconductor integrated circuit packages. The present invention is well adapted to enable production of more reliable integrated circuit packages having less waste during manufacturing, resulting in lower costs to the consumer.

The system and method of the present invention, therefore, is well adapted to carry out the objects and attain the ends and advantages mentioned, as well as others inherent therein. While a presently preferred embodiment of the invention has been given for purposes of disclosure, numerous changes in the details of construction, interconnection and arrangement of parts will readily suggest themselves to those skilled in the art and which are encompassed within the spirit of the invention and the scope of the appended claims.

What is claimed is:

1. A method for controlling the spread of excess adhesive onto bond finger connections when attaching an integrated circuit die to an integrated circuit package, comprising the step of:
    screen printing a low profile adhesive barrier between the outside perimeter of a die attachment area and the integrated circuit bond finger connections, where the adhesive barrier prevents excess adhesive from spreading onto the bond finger connections.

2. The method of claim 1, wherein the step of screen printing is an epoxy resin solder mask.

3. The method of claim 1, wherein the step of screen printing further comprises the steps of:
    applying a screen printed coating;
    curing the coating: and
    selectively etching the coating to form the barrier.

4. A method of manufacturing a semiconductor integrated circuit package that prevents integrated circuit die adhesive from spreading onto bond finger connections of the integrated circuit package, comprising the steps of:
    screen printing a low profile adhesive barrier between the outside perimeter of a die attachment area and the integrated circuit bond finger connections;

attaching an integrated circuit die to the integrated circuit package with adhesive, where the adhesive barrier prevents excess adhesive from spreading onto the bond finger connections of the integrated circuit package;

connecting bond pads of the integrated circuit die to the bond finger connections of the integrated circuit package; and encapsulating the integrated circuit die in the integrated circuit package.

* * * * *